United States Patent
Van Cleemput et al.

(10) Patent No.: US 6,395,150 B1
(45) Date of Patent: *May 28, 2002

(54) VERY HIGH ASPECT RATIO GAPFILL USING HDP

(75) Inventors: Patrick A. Van Cleemput, Sunnyvale, CA (US); George D. Papasouliotis, Fishkill; Mark A. Logan, Pleasant Valley, both of NY (US); Bart van Schravendijk, Sunnyvale, CA (US); William J. King, Nashua, NH (US)

(73) Assignee: Novellus Systems, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/053,554

(22) Filed: Apr. 1, 1998

(51) Int. Cl.⁷ .................... C23C 14/00; C23C 14/32; H05H 1/24; H05H 1/02; B44C 1/22
(52) U.S. Cl. .................. 204/192.37; 204/192.37; 204/192.35; 427/569; 427/574; 216/67; 216/79
(58) Field of Search .................. 204/192.32, 192.35, 204/192.37; 427/574, 569; 216/67, 79

(56) References Cited

U.S. PATENT DOCUMENTS

| 3,741,886 | A | * | 6/1973 | Urbanek et al. | 204/298 |
|---|---|---|---|---|---|
| 4,264,409 | A | * | 4/1981 | Forget et al. | 156/643 |
| 4,882,299 | A | * | 11/1989 | Freeman et al. | 437/233 |
| 4,937,094 | A | * | 6/1990 | Doehler et al. | 427/574 |
| 5,118,384 | A | * | 6/1992 | Harmon et al. | 156/643 |
| 5,160,405 | A | * | 11/1992 | Miyauchi et al. | 156/643 |
| 5,270,264 | A | | 12/1993 | Andideh et al. | 437/228 |
| 5,571,576 | A | * | 11/1996 | Qian et al. | 427/574 |
| 5,621,241 | A | | 4/1997 | Jain | 257/632 |
| 5,641,712 | A | * | 6/1997 | Grivna et al. | 438/624 |
| 5,872,058 | A | * | 2/1999 | Van Cleemput et al. | 438/692 |

* cited by examiner

Primary Examiner—Stephen Kalafut
Assistant Examiner—Julian A. Mercado
(74) Attorney, Agent, or Firm—Skjerven Morrill MacPherson LLP; Tom Chen

(57) ABSTRACT

A process for filling high aspect ratio gaps on substrates uses conventional high density plasma deposition processes, with an efficient sputtering inert gas, such as Ar, replaced or reduced with an He inefficient sputtering inert gas such as He. By reducing the sputtering component, sidewall deposition from the sputtered material is reduced. Consequently, gaps with aspect ratios of 6.0:1 and higher can be filled without the formation of voids and without damaging circuit elements.

12 Claims, 2 Drawing Sheets

VERY HIGH ASPECT RATIO GAPFILL USING HDP

FIELD OF THE INVENTION

The present invention relates generally to methods of thin film deposition and, particularly, to a process of filling high aspect ratio gaps on substrates using high density plasma (HDP) chemical vapor deposition (CVD).

DESCRIPTION OF RELATED ART

As semiconductor technology advances, circuit elements and interconnections on wafers or silicon substrates become increasingly more dense. In order to prevent unwanted interactions between these circuit elements, insulator-filled gaps or trenches located therebetween are provided to physically and electrically isolate the elements and conductive lines. However, as circuit densities continue to increase, the widths of these gaps decrease, thereby increasing gap aspect ratios, typically defined as the gap height divided by the gap width. As a result, filling these narrower gaps becomes more difficult, which can lead to unwanted voids and discontinuities in the insulating or gap-fill material.

Currently, high density plasma (HDP) oxide deposition is used to fill high aspect ratio gaps. Typical HDP deposition processes employ chemical vapor deposition (CVD) with a gas mixture containing oxygen, silane, and argon to achieve simultaneous dielectric etching and deposition. In an HDP process, an RF bias is applied to a wafer substrate in a reaction chamber. Some of the gas molecules (particularly argon) in this gas mixture are ionized in the plasma and accelerate toward the wafer surface when the RF bias is applied to the substrate. Material is thereby sputtered when the ions strike the surface. As a result, dielectric material deposited on the wafer surface is simultaneously sputter-etched to help keep gaps open during the deposition process, which allows higher gap aspect ratios to be filled.

FIGS. 1A–1D illustrate, in more detail, the simultaneous etch and deposition (etch/dep) process described above. In FIG. 1A, $SiO_2$, formed from silane ($SiH_4$) and oxygen ($O_2$), begins depositing on the surface of a wafer 100 for filling a gap 110 between circuit elements 120. As the $SiO_2$ is being deposited, charged ions impinge on the $SiO_2$ or dielectric layer 125, thereby simultaneously etching the $SiO_2$ layer. However, because the etch rate at about 45° is approximately three to four times the etch rate on the horizontal surface, 45° facets 130 form at the corners of elements 120 during the deposition process, as shown in FIG. 1B. FIGS. 1C and 1D show the process continuing to fill gap 110 with simultaneous etching and deposition of $SiO_2$.

In FIGS. 1A–1D, the etch/dep ratio is optimized such that facets 130 remain at the corners of circuit elements 120 throughout the HDP deposition process. However, as shown in FIG. 2A, if the etch/dep ratio is decreased, facets 130 begin moving away from the corners of elements 120, and cusps 210 begin to form on sidewalls of gap 110. Cusp formation is due to some of the etched $SiO_2$ being redeposited on opposing surfaces through line-of-sight redeposition, even though most of the etched $SiO_2$ is emitted back into the plasma and pumped out of the reaction chamber. This redeposition increases as the distance between opposing surfaces decreases. Therefore, as facets 130 move away from the corners of elements 120, the line-of-sight paths are shortened, resulting in increased sidewall redeposition. At a certain point in the process, cusps 210 will meet and prevent further deposition below the cusps. When this occurs, a void 220 is created in dielectric layer 125, as shown in FIG. 2B.

On the other hand, if the etch/dep ratio is increased, as shown in FIG. 3, the etching component can etch or "clip" material from the corners of elements 120, thereby damaging elements 120 and introducing etched contaminants 310 into dielectric layer 125.

The etch/dep ratio can be controlled by varying the flow rate of silane or other process gases, which affect the deposition rate, or by varying either the power supplied to the wafer for biasing or the flow rate of argon, which affect the sputter etch rate. Etch rates are typically increased by increasing the flow rate of argon, which is used solely to promote sputtering, rather than increasing power and expending large amounts of energy. Typical argon flow rates for HDP deposition range from 30%–60% or more of the total process gas flow rate. By optimizing the etch/dep ratio, gaps with aspect ratios of up to about 3.0:1 can be filled without void formation. However, as shown in FIG. 4, filling higher gap aspect ratios results in voids 410 due to cusps 420 prematurely closing the gaps even if the etch/dep ratio is optimized to 1 at the element corners. As discussed above, this is due mainly to the shortened line-of-sight path between opposing sidewalls. If the etch rate is increased to keep the gaps open longer, undesirable corner clipping can occur.

Therefore, with increasing circuit densities, higher gap aspect ratios need to be filled without the problems discussed above with current HDP deposition processes.

SUMMARY

In accordance with the present invention, a high aspect ratio gap-fill process uses high density plasma (HDP) deposition processes with helium or other inefficient sputtering inert gases instead of argon to reduce the effects of sputtering and redeposition. In some embodiments, argon can be eliminated. Because the sputtering agent is greatly reduced, the etch or sputter rate decreases and the facet moves away from the element corners, as expected. However, cusps do not form on the element sidewalls because much less material is etched and available for redeposition. Consequently, with a greatly reduced sputter component, gaps remain open longer so that higher aspect ratio gaps can be filled without the formation of voids.

Because oxygen also contributes to the sputtering component, reducing the partial pressure of oxygen further reduces the sputtering and redeposition effect and allows increased gap-fill capabilities. However, in order to preserve the stoichiometry of the film, the partial pressure of silane ($SiH_4$) is decreased as well. Helium, which is an inefficient sputtering agent, can be added to maintain a constant overall process gas flow rate and provide a constant uniform deposition rate across the wafer.

The present invention will be better understood in light of the following detailed description, taken together with the accompanying drawings.

BRIEF DESCRIPTION OF THE DRAWINGS

Use of the same reference numbers in different figures indicates similar or like elements.

DETAILED DESCRIPTION

Figure 1A:
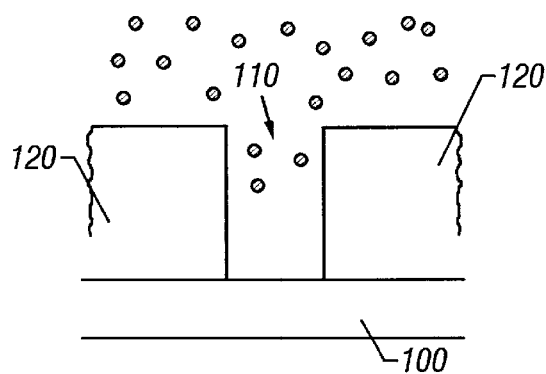
FIGS. 1A–1D are sequential views of a conventional HDP deposition process with optimized etch/dep ratios.
Figure 1B:
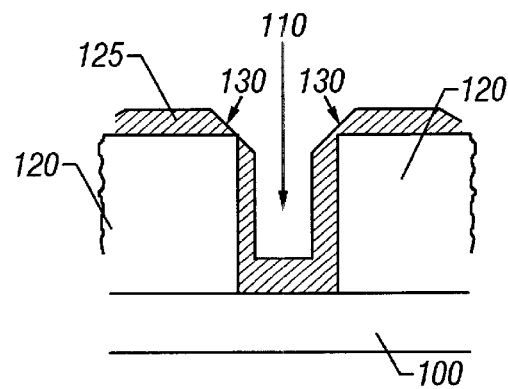
Figure 1C:
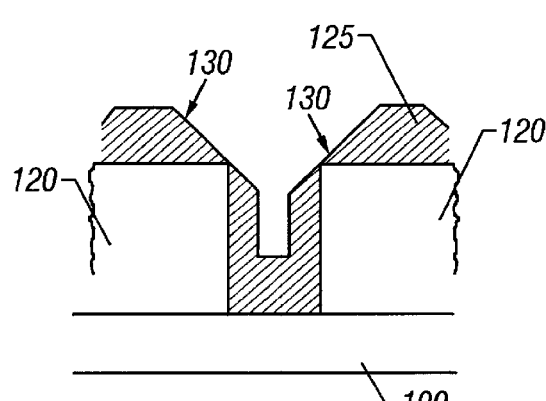
Figure 1D:
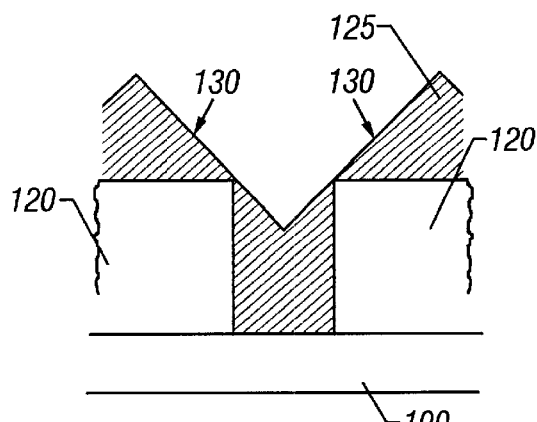
Figure 2A:
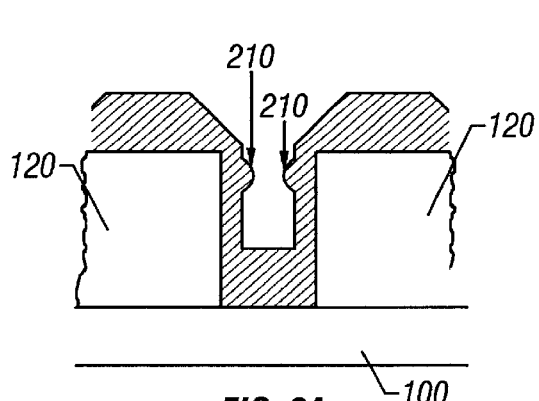
FIGS. 2A–2B are sequential views illustrating void formation when the etch/dep ratio decreases using a conventional HDP process.
Figure 2B:
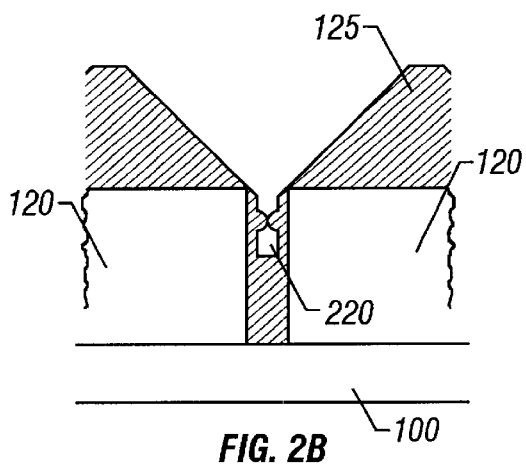
Figure 3:
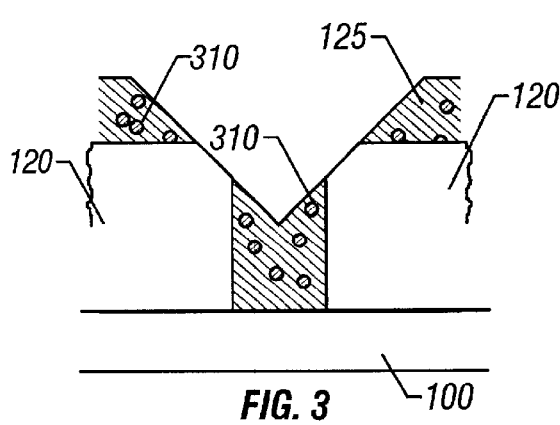
FIG. 3 is a picture of "clipped" corners when the etch/dep ratio increases using conventional HDP processes.
Figure 4:
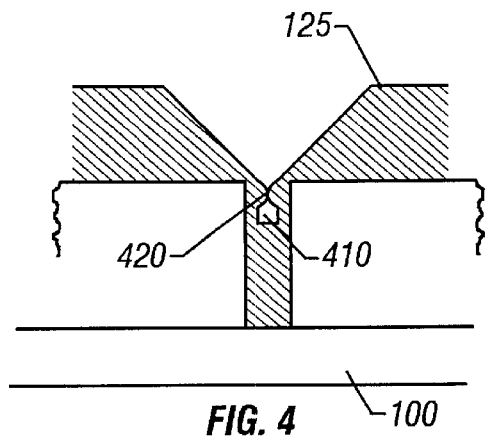
FIG. 4 is a picture of void formation when filling a high aspect ratio gap using a conventional HDP process.

In accordance with an embodiment of the present invention, a process using high density plasma (HDP) deposition with helium or other inefficient inert sputtering gases, is provided, which allows high aspect ratio gaps to be filled without voids or clipped corners associated with conventional methods.

Similar to conventional HDP deposition processes, a gas mixture is used containing silane ($SiH_4$) and oxygen ($O_2$). However, contrary to conventional HDP processes, argon (Ar) is not used; rather an inefficient sputtering gas with an atomic weight lower than Ar is used, such as helium (He) or hydrogen (H). A mixture of $SiH_4$, $O_2$, and He is used to simultaneously deposit and etch dielectric material, where $SiH_4$ and $O_2$ are used to form $SiO_2$ for the deposition component, and $O_2$ and He are used for the sputtering component. These gases are not limiting, and other suitable gases include any gases normally used for a particular film deposition process.

By replacing Ar with He, the sputtering and redeposition effect is greatly reduced. Further, since $O_2$ also contributes to sputtering, reducing the partial pressure of $O_2$ further reduces sputtering. Accordingly, less material is sputtered and redeposited, thereby allowing even higher aspect gap ratios to be filled. However, by reducing the partial pressure of $O_2$, the partial pressure of $SiH_4$ must also be reduced proportionally if the stoichiometry of the film is to be preserved. As a result of the partial pressures of both $O_2$ and $SiH_4$ being reduced, the flow rate of the process gas decreases. Thus, in order to preserve the uniformity of the deposition rate across the wafer, He or another low weight inert gas, is added to maintain a constant overall process flow rate.

As an example, Table 1 below lists the three gases and their respective gas flow ranges, with the actual gas flow amount dependent upon the application and wafer size. Note that the mole fraction of He in such a process gas is in the range of 15%–90% of the total gas mixture, as He also acts as a diluent in the gas mixture.

TABLE 1

| Gas | Flow Rate (sccm) |
|---|---|
| $SiH_4$ | 10–250 |
| $O_2$ | 10–1000 |
| He | 10–2000 |

In addition to the reduction or elimination of Ar, the method of the present invention also allows lower pressures than prior HDP processes. The present invention can be run at pressures below 10 mTorr. The other process parameters remain the same as with prior HDP processes. For example, temperatures can range from 375° C. to 700° C. and are determined by the type of film deposition. For instance, in STI and PMD steps, temperatures can reach up to 700° C., while in IMD and passivation steps, temperatures typically cannot exceed 400° C. to 450° C. Low frequency (LF) and high frequency (HF) power requirements are similarly unchanged, with the LF power ranging from 1 kW to 10 kW, and high frequency (HF) power ranges from 0.5 kW to 10 kW, dependent upon the wafer size (e.g., 200 or 300 mm diameter) and the process being used.

The reduced sputter etch rate resulting from the replacement of A-with He allows higher aspect ratio gaps to be filled without the formation of voids, as illustrated in FIGS. 5A–5D.

Figure 5A:
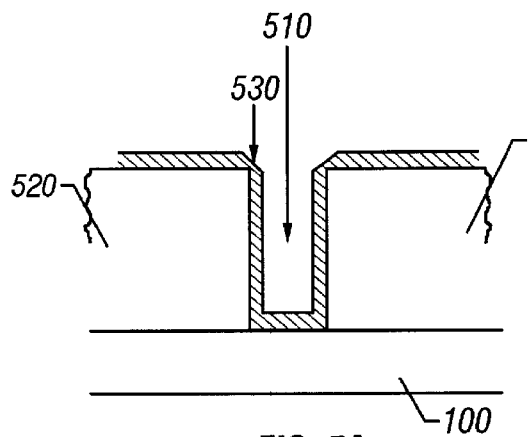
FIGS. 5A–5D are sequential views of high aspect ratio gaps filled with the method of the present invention.
Figure 5B:
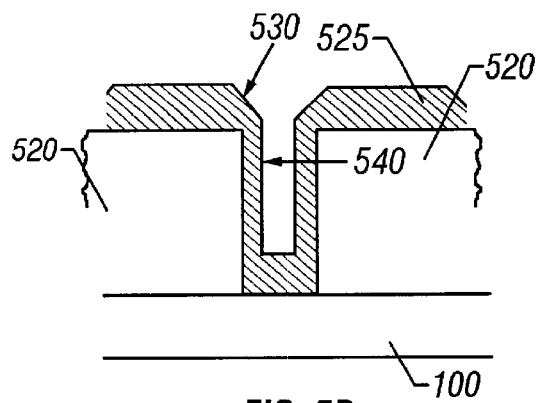
Figure 5C:
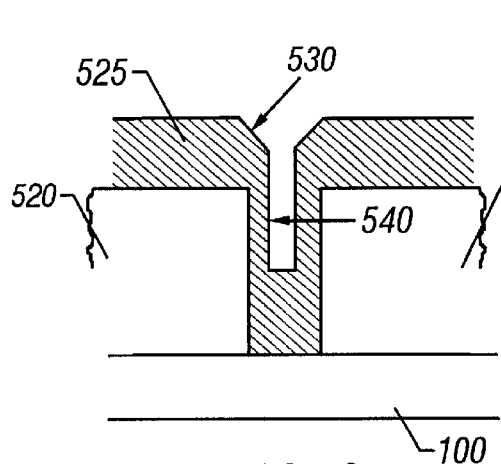

In FIG. 5A, circuit elements 520 are formed on a substrate or wafer 100, creating gaps 510 therebetween. Circuit elements 520 can be, for example, transistors, conductors, or interconnects. A gap 510 with a high aspect ratio, typically greater than 2.5:1, is filled using HDP deposition, where sputtering is accomplished with He and $O_2$. During the initial stages of the process, 45° facets 530 form at the corners of circuit elements 520, as shown in FIG. 5A. Even though drastically reduced, an etching component from the He and $O_2$ still exists to form the facets 530 in FIG. 5A. However, because the etching component is reduced, facets 530 begin to move away from the corners of circuit elements 520 as more material deposits on the surfaces to form the $SiO_2$ or dielectric layer 525, as shown in FIGS. 5B and 5C.

Figure 5D:
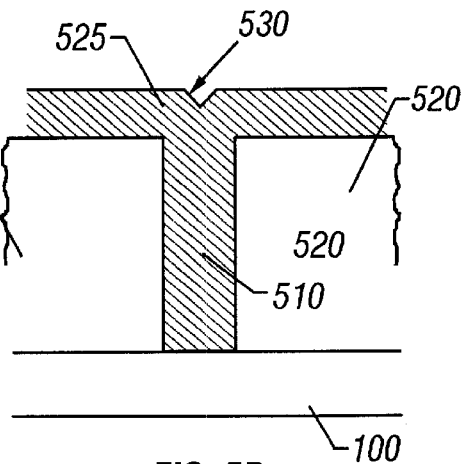

Another consequence of replacing Ar with He is that sidewall redeposition is reduced. Because the sputtering component is greatly reduced, much less material is available to redeposit on sidewalls 540 and facets 530, as shown in FIGS. 5B and 5C. As a result, cusp formation is drastically reduced, and facets move away more slowly from the corners of the circuit elements. Because there is very little sidewall deposition, which is mainly driven by redeposition, high aspect ratio gaps do not close prematurely even though the facets are moving away from the corners. FIG. 5D then shows high aspect ratio gap 510 filled without void formation or clipping. Note that since $O_2$ also acts as a sputtering agent, He can be used to reduce the sputtering effects from $O_2$.

In accordance with the present invention, gaps with aspect ratios of 6.0:1 or greater and with widths of 0.1 micron or less have been filled without the formation of voids.

Therefore, by replacing an efficient sputtering agent such as Ar with an inefficient sputtering agent such as He, a void-free gapfill is possible at higher aspect ratios than are possible with conventional HDP deposition processes.

The above description illustrates the use of undoped silicon oxide in a shallow trench isolation (STI) step, in which large numbers of small, closely spaced transistors are isolated from each other by filling gaps with a dielectric layer. The highest aspect ratios (>3.0:1) are associated with the STI step. However, the method of the present invention cat also be used in other steps in the production of integrated circuits where films are deposited, such as the pre-metal dielectric (PMD), inter-metal dielectric (IMD), passivation, and anti-reflective layer (ARL) steps. PMD steps typically provide insulator layers, e.g., P, B, Ge, or BP-doped oxide, between polysilicon structures and the first metal interconnect layer. On the other hand, IMD steps provide insulator layers, e.g., undoped $SiO_2$ or F-doped oxide, between subsequent metal interconnect layers. Passivation steps provide protection layers, such as SiN, SiC, or SiON, for the wafer, while ARL steps deposit layers for photolithography improvements. For deposition of anti-reflective layer (ARL) steps, $N_2O$ needs to be added to the reactive mixture. Those skilled in the art will appreciate that the use of dopants, such as phosphine ($PH_3$), silicon tetrafluoride ($SiF_4$), $C_2F_6$, nitrogen trifluoride ($NF_3$), methane, ethylene, acetylene, $B_2H_6$, or germanium bearing compounds (including, but not limited to tetramethyl and tetraethyl germanium) for deposition of these other films is within the scope of this invention.

For example, the present invention can also be used to form a gap-free phosphorus-doped silicon oxide (PSG) film over high aspect gap ratios. Table 2 below shows typical gases and their respective gas flow ranges for forming a PSG film in an HDP-CVD reactor, where the actual gas flow amount depends upon the requirements of the film and the wafer size.

TABLE 2

| Gas | Flow Rate (sccm) |
|---|---|
| $SiH_4$ | 10–250 |
| $O_2$ | 10–1000 |
| He | 10–2000 |
| $PH_3$ | 10–100 |
| $B_2H_6$ | 10–100 |
| Ar | 0–100 |

Those skilled in the art will recognize that Ar does not need to be completely eliminated if the concentration of He is high enough to dilute the effects of sputtering and redeposition in accordance with the present invention. Other system parameters are similar to conventional PSG film deposition. For example, the LF power typically varies from 1 kW to 10 kW, and the HF power typically varies from 0.5 kW to 10 kW depending on the wafer size (e.g., 200 or 300 mm diameter) and the requirements of the specific process being used.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the true spirit and scope of this invention.

We claim:

1. A process for filling gaps during integrated circuit production, comprising:
    providing a gas mixture comprised of silicon-containing and oxygen-containing components and consisting of one inert component, wherein said inert component is helium; and
    depositing a film over said gaps by using said gas mixture for simultaneous CVD and sputter etching using a plasma of uniform plasma density.

2. The process of claim 1, wherein said He is at a flow rate of 10 to 2000 sccm.

3. The process of claim 1, wherein said He is at a mole fraction between 15% and 90% of said gas mixture.

4. The process of claim 1, wherein said helium is used as a filler gas.

5. The process of claim 1, wherein said helium is used to maintain a constant overall process gas flow rate.

6. A process for filling gaps during integrated circuit production, comprising:
    depositing a film over said gaps by HDP deposition using a gas mixture comprised of silicon-containing and oxygen-containing components and consisting of one inert component, wherein said inert component is helium, and wherein plasma utilized in the HDP deposition has a uniform plasma density.

7. The process of claim 6, wherein said helium is used as a filler gas.

8. The process of claim 6, wherein said helium is used to maintain a constant overall process gas flow rate.

9. A process for filling gaps during integrated circuit production, comprising:
    depositing a film over said gaps by HDP deposition using a gas mixture for simultaneous CVD and sputter etching comprised of a silicon-containing component and consisting of two sputtering components, wherein said sputtering components are hydrogen and oxygen, and wherein plasma utilized in the HDP deposition has a uniform plasma density.

10. A process for filling gaps during integrated circuit production, comprising:
    providing a gas mixture comprised of silicon-containing and oxygen-containing components and consisting of one inert component, wherein said inert component is helium, said helium being used as a filler gas; and
    depositing a film over said gaps by using said gas mixture for simultaneous CVD and sputter etching.

11. A process for filling gaps during integrated circuit production, comprising:
    depositing a film over said gaps by HDP deposition using a gas mixture comprised of silicon-containing and oxygen-containing components and consisting of one inert component, wherein said inert component is helium, said helium being used as a filler gas.

12. A process for filling gaps during integrated circuit production, comprising:
    depositing a film over said gaps by HDP deposition using a gas mixture for simultaneous CVD and sputter etching comprised of a silicon-containing component and consisting of two sputtering components, wherein said sputtering components are hydrogen and oxygen, said hydrogen being used as a filler gas.

* * * * *